US008802484B1

(12) United States Patent
Verma et al.

(10) Patent No.: US 8,802,484 B1
(45) Date of Patent: Aug. 12, 2014

(54) INTEGRATION OF GERMANIUM PHOTO DETECTOR IN CMOS PROCESSING

(71) Applicants: Purakh Raj Verma, Singapore (SG); Guowei Zhang, Singapore (SG); Kah Wee Ang, Singapore (SG)

(72) Inventors: Purakh Raj Verma, Singapore (SG); Guowei Zhang, Singapore (SG); Kah Wee Ang, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/747,009

(22) Filed: Jan. 22, 2013

(51) Int. Cl.
*H01L 21/00* (2006.01)
*H01L 31/102* (2006.01)

(52) U.S. Cl.
USPC ............. 438/94; 438/57; 438/93; 438/96; 438/97; 257/184

(58) Field of Classification Search
None
See application file for complete search history.

(56) References Cited

U.S. PATENT DOCUMENTS

| | | | |
|---|---|---|---|
| 7,262,117 B1* | 8/2007 | Gunn et al. | 438/481 |
| 2003/0089929 A1* | 5/2003 | Rhodes | 257/219 |
| 2009/0032685 A1* | 2/2009 | Rhodes | 250/214.1 |
| 2010/0059822 A1* | 3/2010 | Pinguet et al. | 257/351 |
| 2011/0027950 A1* | 2/2011 | Jones et al. | 438/155 |
| 2012/0043637 A1* | 2/2012 | King et al. | 257/461 |
| 2013/0334638 A1* | 12/2013 | Chen et al. | 257/432 |

OTHER PUBLICATIONS

T.H.Loh et al.; Selective epitaxial germanium on silicon-on-insulator high speed photodetectors using low-temperature ultrathin SiO.8Ge02 buffer, American Institute of Physics, 2007.
Tsutomo Tashiro et al., A Selective Epitaxial SiGe/Si Planar Photodetector for Si-Based OEIC's,IEEE Transactions on Electron Devices, vol. 44, No. 4, Apr. 1997; pp. 545-550.
L. Vescan et al., Facet investigation in selective epitaxial growth of Si and SiGe on (001) Si for optoelectronic device, J. Vac. Sci. Technol., vol. B 16 (3) , May/Jun. 1998, pp. 1549-1554.
N.R.Das, Si-based Photodetectors in Optical Communication, International Conference on Emerging Trends in Electronic and Photonic Devices & Systems, 2009, pp. 436-441.

* cited by examiner

*Primary Examiner* — Julio J Maldonado
*Assistant Examiner* — Harpreet Singh
(74) *Attorney, Agent, or Firm* — Ditthavong & Steiner, P.C

(57) ABSTRACT

A method and device are provided for forming an integrated Ge or Ge/Si photo detector in the CMOS process by non-selective epitaxial growth of the Ge or Ge/Si. Embodiments include forming an N-well in a Si substrate; forming a transistor or resistor in the Si substrate; forming an ILD over the Si substrate and the transistor or resistor; forming a Si-based dielectric layer on the ILD; forming a poly-Si or a-Si layer on the Si-based dielectric layer; forming a trench in the poly-Si or a-Si layer, the Si-based dielectric layer, the ILD, and the N-well; forming Ge or Ge/Si in the trench; and removing the Ge or Ge/Si, the poly-Si or a-Si layer, and the Si-based dielectric layer down to an upper surface of the ILD. Further aspects include forming an in-situ doped Si cap epilayer or an ex-situ doped poly-Si or a-Si cap layer on the Ge or Ge/Si.

14 Claims, 5 Drawing Sheets

INTEGRATION OF GERMANIUM PHOTO DETECTOR IN CMOS PROCESSING

TECHNICAL FIELD

The present disclosure relates to semiconductor devices with an integrated photo detector. The present disclosure is particularly applicable to complementary-metal-oxide-semiconductor (CMOS) devices including an integrated photo detector.

BACKGROUND

The increasing demand for communication bandwidth continually challenges the capability of copper-based interconnects, which causes more and more electronic manufacturers to turn towards using photonics. In particular, photo detector (PD) integration in the silicon (Si)-based CMOS process has been widely talked about and shows promise for usage in various equipment such as local area networks (LANs). Currently, most popular fabrication techniques include selective epitaxial (epi) growth of germanium (Ge) or germanium-silicon (Ge/Si) multi-layers to integrate a photo detector during the CMOS process. However, the growth rate associated with selective epitaxial growth is very low and due to the non-uniformity of the selective epitaxial window opening, the epi thickness may be varied at different locations and with different openings (normally referred to as loading effect). Further, at the same time, there can be facet formation during selective epitaxial growth.

A need therefore exists for methodology enabling a non-selective growth of a photo detector material integrated into the CMOS process, and the resulting device.

SUMMARY

An aspect of the present disclosure is method of forming an integrated Ge or Ge/Si photo detector in the CMOS process by non-selective epitaxial growth of the Ge or Ge/Si.

Another aspect of the present disclosure is a device including an integrated Ge or Ge/Si photo detector with non-selective epitaxial growth of the Ge or Ge/Si.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method including: forming an N-well in a Si substrate; forming a transistor or resistor in the Si substrate laterally removed from the N-well; forming an interlayer dielectric (ILD) over the Si substrate and the transistor or resistor; forming a Si-based dielectric layer on the ILD; forming a polysilicon (poly-Si) or amorphous silicon (a-Si) layer on the Si-based dielectric layer; removing a portion of the poly-Si or a-Si layer, the Si-based dielectric layer, the ILD, and the N-well, forming a trench; forming Ge or Ge/Si in the trench; and removing the Ge or Ge/Si, the poly-Si or a-Si layer, and the Si-based dielectric layer down to an upper surface of the ILD.

Aspects of the present disclosure include forming the Si-based dielectric and poly-Si or a-Si layers by blanket deposition. Further aspects include forming the Si-based dielectric layer of silicon nitride (SiN), silicon dioxide (SiO$_2$), or silicon oxynitride (SiON). Additional aspects include forming the Si-based dielectric layer to a thickness of 500 angstroms (Å) to 1,500 Å; and forming the poly-Si or a-Si layer to a thickness of 600 Å to 2,000 Å. Further aspects include forming the trench by plasma etching or reactive-ion etching (RIE). Another aspect includes forming the trench to a width of 5 micrometers (μm) to 200 μm. Other aspects include forming the trench to a depth of 3,500 Å to 5,500 Å. Further aspects include forming the Ge or Ge/Si in the trench and on the poly-Si or a-Si layer by non-selective epitaxial growth. Additional aspects include removing the Ge or Ge/Si and the poly-Si or a-Si layer down to an upper surface of the Si-based dielectric layer by chemical mechanical polishing (CMP); and removing the Si-based dielectric layer by a wet chemical etch down to the upper surface of the ILD. Further aspects include forming a doped Si cap layer on the Ge or Ge/Si, wherein the doped Si cap includes an in-situ doped Si epilayer or an ex-situ doped poly-Si or a-Si layer, and wherein the doped Si cap layer extends over a portion of the ILD. Additional aspects include forming a second ILD to a thickness of 6,000 Å to 10,000 Å over the ILD and Si cap; and forming a contact through the second ILD down to the doped Si cap.

Another aspect of the present disclosure is a device including: a Si substrate; an N-well in the Si substrate; a transistor or resistor on the Si substrate laterally removed from the N-well; an ILD over the transistor or resistor and the substrate; an integrated Ge or Ge/Si photo detector through a portion of the ILD and partially into the N-well; and a doped Si cap layer over the Ge or Ge/Si photo detector. Aspects of the device include the Ge or Ge/Si photo detector being formed by non-selective epitaxial growth. Other aspects include the integrated Ge or Ge/Si photo detector having a width of 5 μm to 200 μm. Further aspects include the integrated Ge or Ge/Si photo detector having a depth of 3,500 Å to 5,500 Å. Additional aspects include the doped Si cap layer extending over a portion of the ILD. Another aspect includes the doped Si cap including an in-situ doped Si epilayer or an ex-situ doped poly-Si or a-Si layer.

Another aspect of the present disclosure is a method including: forming an N-well and a P-well in a silicon-on-insulator (SOI) substrate; forming a CMOS transistor or resistor on the SOI substrate over the P-well; forming a first ILD over the SOI substrate and the CMOS transistor or resistor; depositing a SiN layer on the first ILD; depositing a poly-Si or a-Si on the SiN layer; removing a portion of the SiN layer, the poly-Si or a-Si layer, the first ILD, and the N-well, forming a trench; epitaxially growing Ge or Ge/Si in the trench and over the a-Si or poly-Si; removing the Ge or Ge/Si, the poly-Si or a-Si layer, and the SiN layer down to an upper surface of the first ILD; forming a doped Si cap layer on the Ge or Ge/Si, with a portion extending over the first ILD; forming a second ILD over the doped Si cap and on the first ILD; and forming a plurality of contacts through the second ILD. Aspects include depositing the SiN and the a-Si or poly-Si layers by blanket deposition. Further aspects include forming the Ge or Ge/Si with a width of 5 μm to 200 μm and a depth of 3,500 Å to 5,500 Å.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure.

Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
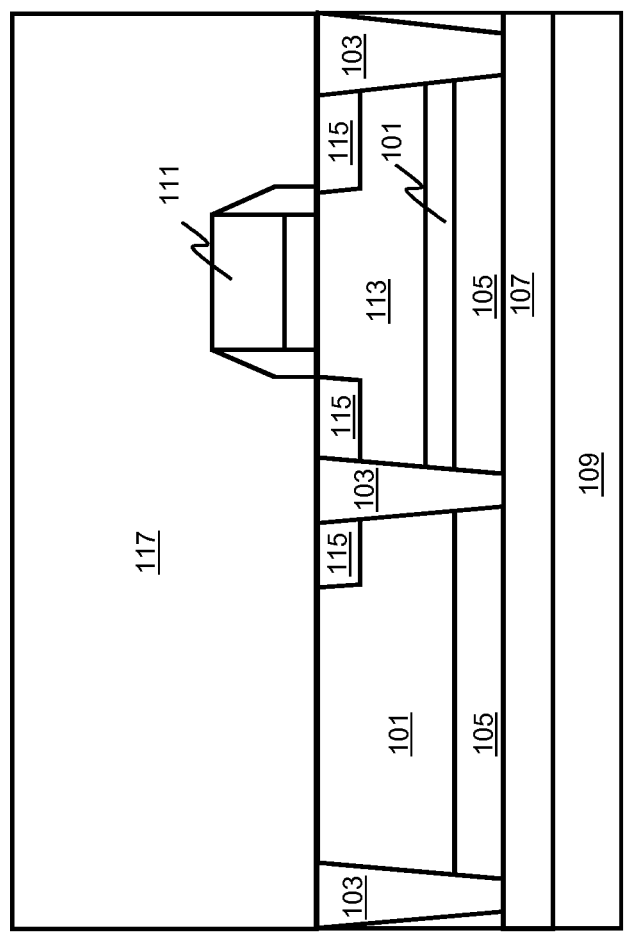
FIGS. 1 through 5 illustrate a process flow for forming an integrated Ge or Ge/Si photo detector in the CMOS process by non-selective epitaxial growth of the Ge or Ge/Si, in accordance with an exemplary embodiment of the present disclosure.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of low growth rate, varied epi thickness at different locations, i.e., loading effect, and possible facet formation attendant upon integrating photo detectors using selective epi growth of Ge or Ge/Si multi-layers into CMOS process. In accordance with embodiments of the present disclosure, additional SiN and poly-Si are deposited allowing for non-selective epi-growth of Ge on the photo detector area and other areas.

Methodology in accordance with embodiments of the present disclosure includes forming an N-well in a Si substrate. A transistor or resistor is formed in the Si substrate laterally removed from the N-well. An ILD is formed over the Si substrate and the transistor or resistor. A Si-based dielectric layer is formed on the ILD. A poly-Si or a-Si layer is formed on the Si-based dielectric layer. A portion of the poly-Si or a-Si layer, the Si-based dielectric layer, the ILD, and the N-well is removed, forming a trench. Ge or Ge/Si is formed in the trench. The Ge or Ge/Si, the poly-Si or a-Si layer, and the Si-based dielectric layer are then removed down to an upper surface of the ILD.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1 through 5 illustrate a process flow for forming a Ge or Ge/Si photo detector integrated into CMOS processing including non-selective epitaxial growth of the Ge or Ge/Si, in accordance with an exemplary embodiment of the present disclosure. Adverting to FIG. 1, an N-Well 101 and buried N+ layers 105 are formed in a Si substrate that includes deep trenches 103, a SOI substrate 107, and a Si substrate layer 109. A P-Well 113 is formed in the Si substrate proximate to N-Well 101. A transistor or resistor 111, laterally removed from the N-Well 101, is then formed on the Si substrate. The transistor or resistor 113 includes a gate electrode and source/drain regions 115 in the substrate at opposite sides of the gate electrode. Thereafter, an ILD 117, e.g., of $SiO_2$, is formed over the Si substrate and transistor or resistor 111.

Figure 2:
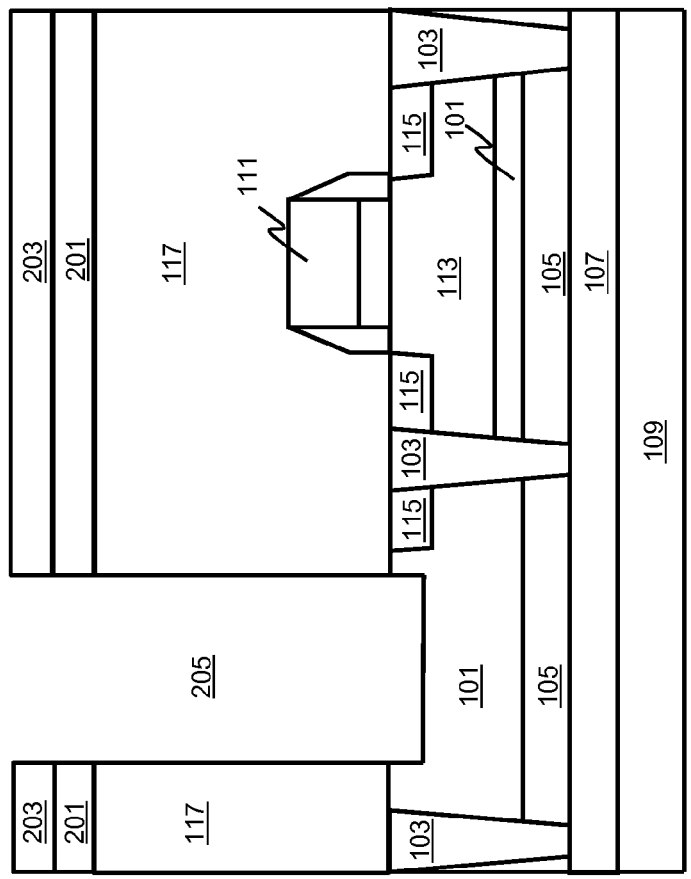

Next, a Si-based dielectric layer 201, e.g., of SiN, $SiO_2$, or SiOn, is formed by blanket deposition on the ILD 117, for example to a thickness of 500 Å to 1,500 Å, as illustrated in FIG. 2. A poly-Si or a-Si layer 203 is then formed by blanket deposition, for example to a thickness of 600 Å to 2,000 Å, on the Si-based dielectric layer 201. Thereafter, a portion of the poly-Si or a-Si layer 203, the Si-based dielectric layer 201, the ILD 117, and the N-Well 101, laterally removed from the transistor or resister 111, is removed by plasma etching or reactive-ion etching (RIE) to form a trench 205 that is, for example, 5 μm to 200 μm wide and 3,500 Å to 5,500 Å deep.

Figure 3:
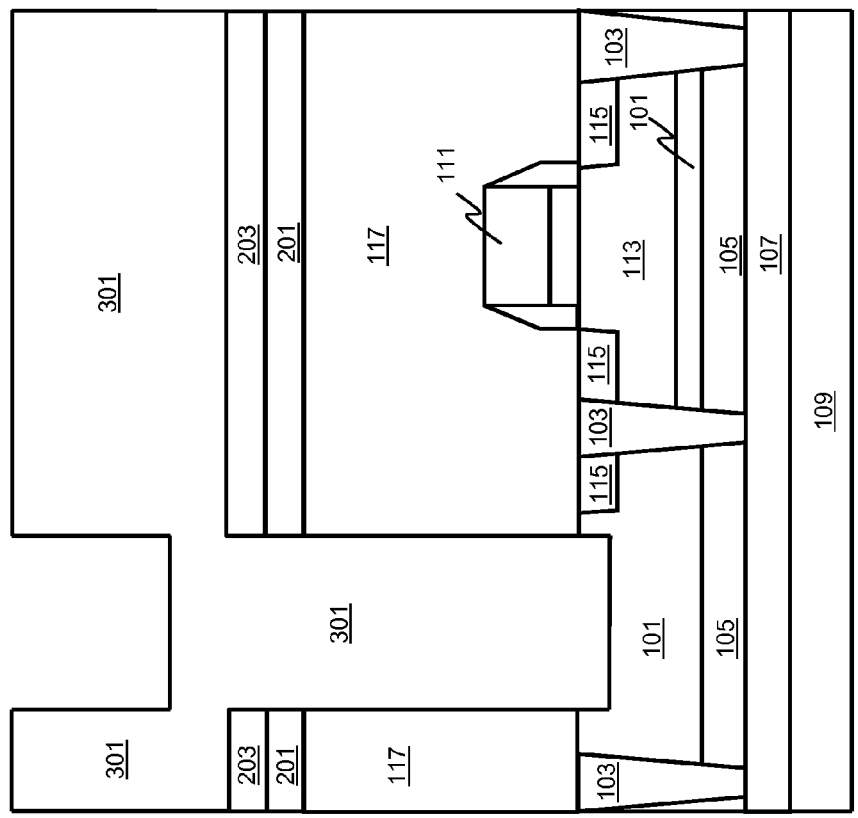
Figure 4:
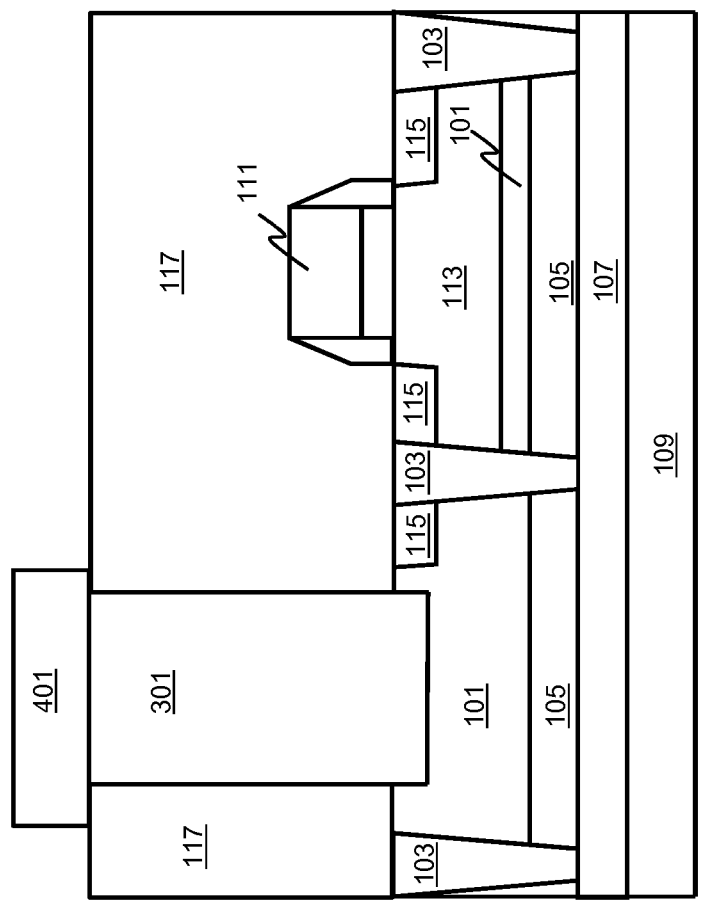

As illustrated in FIG. 3, Ge or Ge/Si 301 (for the Ge or Ge/Si photo detector) is formed in the trench 205 by non-selective epitaxial growth. Next, the Ge or Ge/Si 301 and the poly-Si or a-Si layer 203 are removed down to an upper surface of the Si-based dielectric 201 by CMP as illustrated in FIG. 4. Thereafter, the Si-based dielectric 201 is removed by a wet chemical etch down to the upper surface of the ILD 117. Once the Si-based dielectric 201 is removed, a doped Si cap layer 401, e.g., an in-situ doped Si epilayer or a doped poly-Si or a-Si layer, is formed on the Ge or Ge/Si 301 to passivate the Ge or Ge/Si detector. The doped Si cap layer 401 may extend over a portion of the ILD 117.

Figure 5:
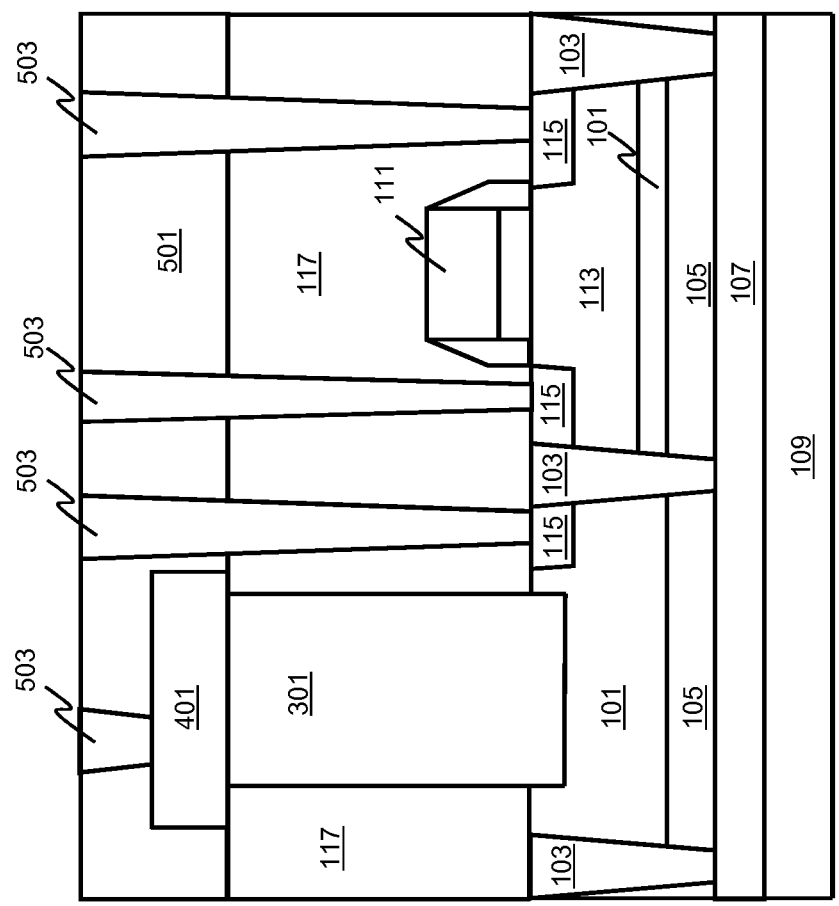

Adverting to FIG. 5, a second ILD layer 501 of $SiO_2$ is formed to a thickness of 6,000 Å to 10,000 Å over the ILD 117 and doped Si cap layer 401. Next, contacts 503 are formed through the second ILD layer 501 down to the doped Si cap layer 401 and the source/drain regions 115 following standard CMOS processes for contact formation and back end of line (BEOL) metallization.

The embodiments of the present disclosure can achieve several technical effects including a CMOS compatible method to integrate a Ge or Ge/Si photo detector into the standard CMOS process. In addition, because the epitaxial step is non-selective, the growth rate is faster with better uniformity, minimal loading effect, and an absence of facet formation. The present disclosure enjoys industrial applicability in any of various types of highly integrated semiconductor devices including an integrated photo detector.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming an N-well in a silicon (Si) substrate;
    forming a transistor or resistor in the Si substrate laterally removed from the N-well;
    forming an interlayer dielectric (ILD) over the Si substrate and the transistor or resistor;
    forming a Si-based dielectric layer on the ILD;
    forming a polysilicon (poly-Si) or amorphous silicon (a-Si) layer on the Si-based dielectric layer;

removing a portion of the poly-Si or a-Si layer, the Si-based dielectric layer, the ILD, and the N-well, forming a trench;

forming germanium (Ge) or germanium-silicon (Ge/Si) in the trench; and removing the Ge or Ge/Si, the poly-Si or a-Si layer, and the Si-based dielectric layer down to an upper surface of the ILD.

2. The method according to claim 1, comprising forming the Si-based dielectric and poly-Si or a-Si layers by blanket deposition.

3. The method according to claim 2, comprising forming the Si-based dielectric layer of silicon nitride (SiN), silicon dioxide ($SiO_2$), or silicon oxynitride (SiON).

4. The method according to claim 2, comprising:
forming the Si-based dielectric layer to a thickness of 500 angstroms (Å) to 1,500 Å; and
forming the poly-Si or a-Si layer to a thickness of 600 Å to 2,000 Å.

5. The method according to claim 1, comprising forming the trench by plasma etching or reactive-ion etching (RIE).

6. The method according to claim 1, comprising forming the trench to a width of −5 micrometers (μm) to 200 μm.

7. The method according to claim 1, comprising forming the trench to a depth of 3,500 Å to 5,500 Å.

8. The method according to claim 1, comprising forming the Ge or Ge/Si in the trench and on the poly-Si or a-Si layer by non-selective epitaxial growth.

9. The method according to claim 8, comprising:
removing the Ge or Ge/Si and the poly-Si or a-Si layer down to an upper surface of the Si-based dielectric layer by chemical mechanical polishing (CMP); and
removing the Si-based dielectric layer by a wet chemical etch down to the upper surface of the ILD.

10. The method according to claim 1, further comprising:
forming a doped Si cap layer on the Ge or Ge/Si, wherein the doped Si cap comprises an in-situ doped Si epilayer or an ex-situ doped poly-Si or a-Si layer, and wherein the doped Si cap layer extends over a portion of the ILD.

11. The method according to claim 10, further comprising:
forming a second ILD to a thickness of 6,000 Å to 10,000 Å over the ILD and Si cap; and
forming a contact through the second ILD down to the doped Si cap.

12. A method comprising:
forming an N-well and a P-well in a silicon-on-insulator (SOI) substrate;
forming a complementary metal-oxide-semiconductor (CMOS) transistor or resistor on the SOI substrate over the P-well;
forming a first interlayer dielectric (ILD) over the SOI substrate and the CMOS transistor or resistor;
depositing a silicon nitride (SiN) layer on the first ILD;
depositing a polysilicon (poly-Si) or amorphous silicon (a-Si) on the SiN layer;
removing a portion of the SiN layer, the poly-Si or a-Si layer, the first ILD, and the N-well, forming a trench;
epitaxially growing germanium (Ge) or germanium-silicon (Ge/Si) in the trench and over the a-Si or poly-Si;
removing the Ge or Ge/Si, the poly-Si or a-Si layer, and the SiN layer down to an upper surface of the first ILD;
forming a doped silicon (Si) cap layer on the Ge or Ge/Si, with a portion extending over the first ILD;
forming a second ILD over the doped Si cap and on the first ILD; and
forming a plurality of contacts through the second ILD.

13. The method according to claim 12, comprising depositing the SiN and a-Si or poly-Si layers by blanket deposition.

14. The method according to claim 12, comprising forming the Ge or Ge/Si with a width of 5 μm to 200 μm and a depth of 3,500 Å to 5,500 Å.

* * * * *